United States Patent
Kim (10) Patent No.: US 9,558,829 B2
(45) Date of Patent: *Jan. 31, 2017

(54) SYSTEM HAVING A SEMICONDUCTOR INTEGRATED CIRCUIT DEVICE

(71) Applicant: SK hynix Inc., Icheon-si, Gyeonggi-do (KR)

(72) Inventor: Bo Kyeom Kim, Icheon (KR)

(73) Assignee: SK HYNIX INC., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/957,270

(22) Filed: Dec. 2, 2015

(65) Prior Publication Data

US 2016/0086667 A1 Mar. 24, 2016

Related U.S. Application Data

(63) Continuation of application No. 13/599,997, filed on Aug. 30, 2012, now Pat. No. 9,230,668.

(30) Foreign Application Priority Data

Dec. 1, 2011 (KR) ........................ 10-2011-0127912

(51) Int. Cl.
*G11C 11/34* (2006.01)
*G11C 16/06* (2006.01)
*G11C 16/26* (2006.01)

(52) U.S. Cl.
CPC ............... *G11C 16/06* (2013.01); *G11C 16/26* (2013.01)

(58) Field of Classification Search
CPC ................................. G11C 16/26; G11C 16/06
See application file for complete search history.

(56) References Cited

U.S. PATENT DOCUMENTS

2005/0152188 A1* 7/2005 Ju .................. G11C 16/3454
365/185.22
2006/0007774 A1* 1/2006 Zanardi ................. G11C 16/10
365/235

* cited by examiner

*Primary Examiner* — Richard Elms
*Assistant Examiner* — Mohammed A Bashar
(74) *Attorney, Agent, or Firm* — William Park & Associates Ltd.

(57) ABSTRACT

A semiconductor memory apparatus including a latch unit configured to be driven in response to activation of a reset selection signal and resetting a first node and a second node; and an auxiliary driving unit configured to support a driving force of the latch unit in response to the reset selection signal and a voltage logic level of the first node or the second node, wherein the first node and the second node have substantially opposite voltage logic levels.

19 Claims, 5 Drawing Sheets

SYSTEM HAVING A SEMICONDUCTOR INTEGRATED CIRCUIT DEVICE

CROSS-REFERENCES TO RELATED APPLICATION

The present application is a Continuation of U.S. application Ser. No. 13/599,997, filed on Aug. 30, 2012, and the present application claims priority under 35 U.S.C. §119(a) to Korean application number 10-2011-0127912 filed on Dec. 1, 2011, in the Korean Intellectual Property Office, which is incorporated herein by reference in its entirety as set forth in full.

BACKGROUND

1. Technical Field

The present invention relates to a semiconductor memory apparatus and a semiconductor memory apparatus including a latch circuit.

2. Related Art

A flash memory apparatus, which is a kind of a nonvolatile memory apparatus, programs or reads data in units of page. To this end, the flash memory apparatus includes a page buffer circuit to process large capacity data for a short time. The page buffer circuit includes a latch circuit in order to temporarily store data when programming (i.e., PGM as seen in FIG. 1) or reading the data.

Figure 1:
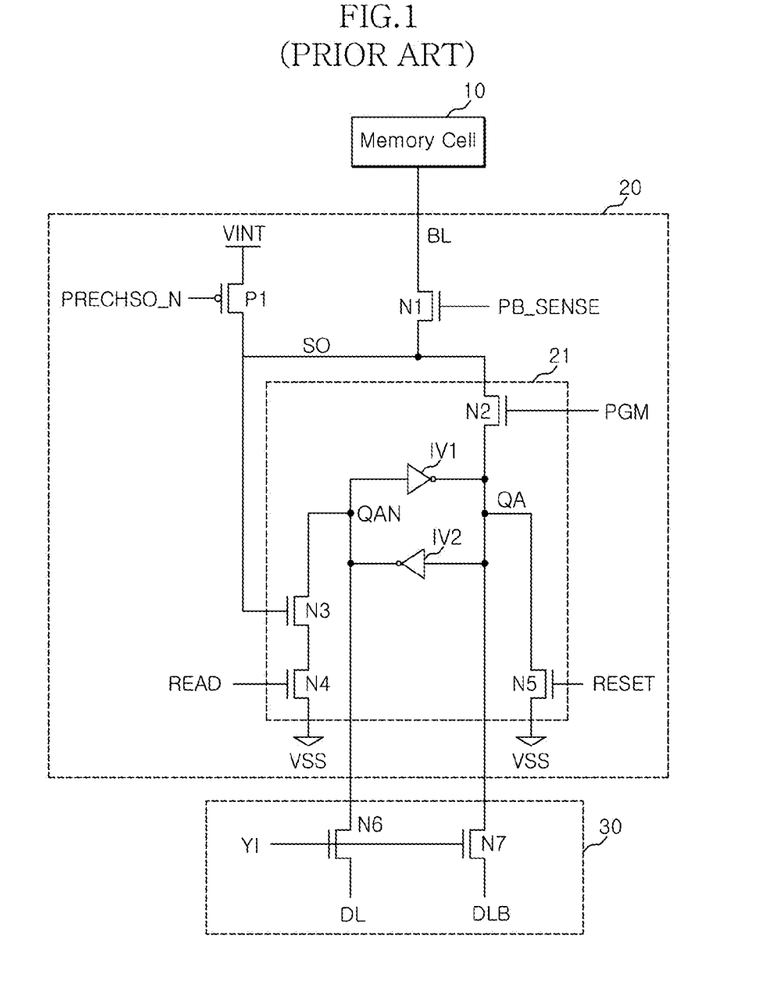
FIG. 1 is a circuit diagram of a general semiconductor memory apparatus including a page buffer.

FIG. 1 is a circuit diagram of a general semiconductor memory apparatus including a page buffer.

A semiconductor memory apparatus, such as a flash memory, is classified into a single level cell (SLC) apparatus, a multi-level cell (MLC) apparatus, and a triple level cell (TLC) apparatus according to bits of data storable per one memory cell. Therefore, the number of latch circuits required changes. FIG. 1 illustrates a page buffer in a general case, and mainly illustrates a latch circuit connected to an output data line in a SLC page buffer.

A semiconductor memory apparatus of FIG. 1 includes a memory cell 10, a page buffer 20, and a column selection unit 30.

The page buffer includes transistors N1 to N5 and P1 as well as ground voltage VSS. In a read operation, the page buffer 20 reads data from the memory cell 10 to output nodes QA and QAN. Then, if a column selection signal YI is applied to a corresponding column, the column selection unit 30 transmits the data to data lines DL and DLB.

The above operation will be described in detail as follows. Initially, a data latch section 21 is initialized by a reset signal RESET. If a precharge signal PRECHSO_N is activated, a sensing node SO is precharged at the level of an internal voltage VINT. Then, if a sensing signal PB_SENSE is activated, data transferred through a bit line BL is transferred to the sensing node SO. At this time, a voltage level of the sensing node SO is equal to or lower than a precharge voltage level according to the data value.

If a read command READ is applied, the data latch section 21 drives the output node QA to have the voltage level of the sensing node SO (the other output node QAN has an opposite voltage logic level) and to latch the value. If the column selection signal YI is applied, voltage levels of the output nodes QA and QAN are output to the data lines DL and DLB, respectively.

Figure 2:
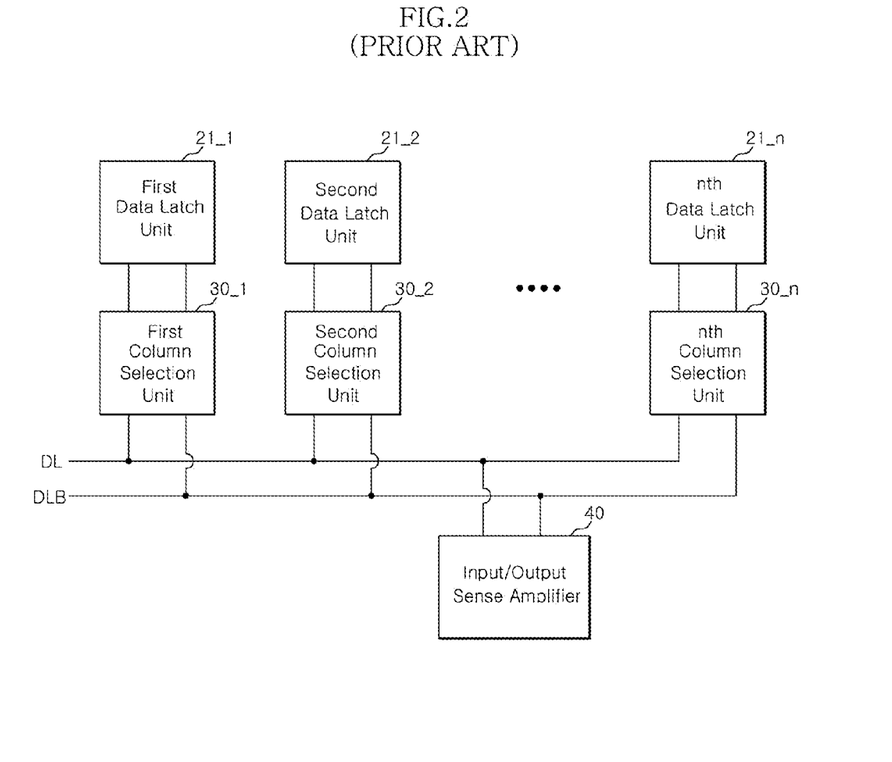
FIG. 2 is a configuration diagram of a data output unit of a general semiconductor memory apparatus.

FIG. 2 is a configuration diagram illustrating a data output unit of a general semiconductor memory apparatus including the data latch section 21.

The data output unit of the general semiconductor memory apparatus includes an input/output sense amplifier 40 in order to amplify data of a small signal. When a plurality of data latch units 21_1, 21_2, to 21_n exist according to the number of page buffers and a corresponding column is selected by column selection units 30_1, 30_2, to 30_n, data stored in the data latch units 21_1 to 21_n is transmitted to and amplified by the input/output sense amplifier 40.

For example, when data of the first data latch unit 21_1 is read, the data is transmitted to the input/output sense amplifier 40 by the first column selection unit 30_1, and the input/output sense amplifier 40 senses and amplifies the received data.

When the first data latch unit 21_1 transmits a high voltage logic level to data lines DL and DLB, a precharge voltage level is transmitted as is. Meanwhile, when it is necessary to transmit a low voltage logic level, the precharge voltage level should be driven to a low voltage logic level for transmission. However, since the capacities of transistors N6 and N7 used in the first column selection unit 30_1 are large, inverters IV1 and IV2 included in the first data latch unit 21_1 are heavily loaded when driving low voltage logic level data. Therefore, although a good performing input/output sense amplifier 40 is used, much data detection time is required.

The problem with a data semiconductor memory apparatus due to a log loading time of the latch circuit is not limited only to a page buffer circuit, and may occur in all semiconductor memory apparatuses using a latch circuit.

SUMMARY

In one embodiment of the present invention, a semiconductor memory apparatus includes: a latch unit configured to be driven in response to activation of a reset selection signal and resetting a first node and a second node; and an auxiliary driving unit configured to support a driving force of the latch unit in response to the reset selection signal and a voltage logic level of the first node or the second node, wherein the first node and the second node have substantially opposite voltage logic levels.

In one embodiment of the present invention, a semiconductor memory apparatus includes: a latch unit configured to be driven in response to the activation of a reset selection signal and resetting a first node and a second node; a first auxiliary driving unit configured to connect the first node to a ground voltage in response to the reset selection signal, and a voltage logic level of the second node or an inverted voltage logic level of the first node; and a second auxiliary driving unit configured to connect the second node to the ground voltage in response to the reset selection signal, and a voltage logic level of the first node or an inverted voltage logic level of the second node, wherein the first node and the second node have opposite voltage logic levels.

In one embodiment of the present invention, a semiconductor memory apparatus includes: a data latch unit configured to detect data of a memory cell, drive the data, and latch the driven data in an output node; a column selection unit configured to connect the output node to a data line when a corresponding column is selected; and an auxiliary driving unit connected to the output node and capable of a data driving force of the data latch unit.

In one embodiment of the present invention, a semiconductor memory apparatus includes: a data latch unit configured to detect data of a memory cell, drive the data, latch the driven data in a first output node, drive an inverted value of the data, and latch the driven value in a second output node; a column selection unit configured to connect the first output node and the second output node to a data line and an inverted data line in response to a column selection signal, respectively; a first auxiliary driving unit connected to the first output node and supporting data driving force of the data latch unit in response to a voltage logic level of the second output node; and a second auxiliary driving unit connected to the second output node and supporting data the driving force of the data latch unit in response to the voltage logic level of the first output node.

In one embodiment of the present invention, a semiconductor memory apparatus includes: a data latch unit configured to detect data of a memory cell, drive the data, latch the driven data in a first output node, drive an inverted value of the data, and latch the driven value in a second output node; a column selection unit configured to connect the first output node and the second output node to a data line and an inverted data line in response to a column selection signal, respectively; and an auxiliary driving unit configured to connect one of the first output node and the second output node to a ground voltage in response to a voltage logic level of the first output node or the second output node.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described in detail with reference to the accompanying drawings through various embodiments.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 3:
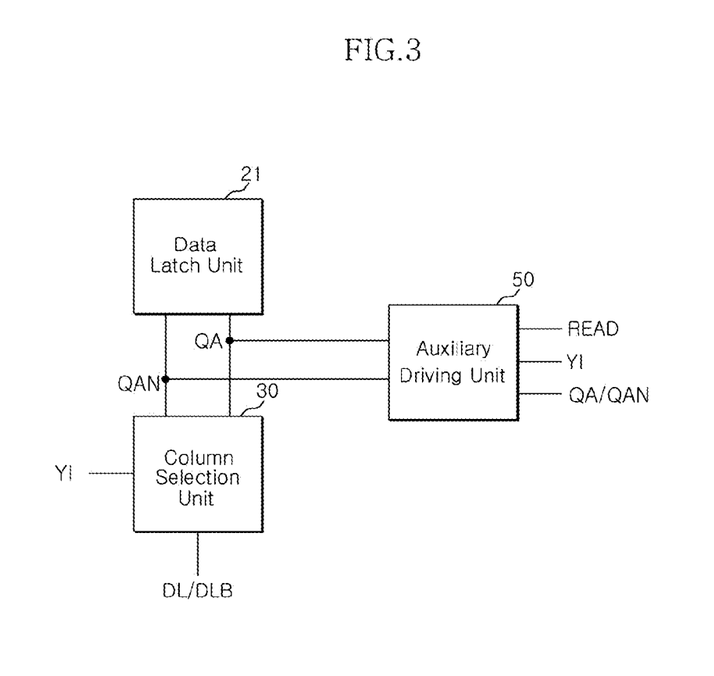
FIG. 3 is a configuration diagram of an example of a semiconductor memory apparatus according to an embodiment.

FIG. 3 is a configuration diagram of an example of a semiconductor memory apparatus according to an embodiment.

FIG. 3 illustrates a flash memory apparatus including a latch circuit, and mainly illustrates the latch circuit connected to data lines in a SLC page buffer. However, the present invention is not limited thereto. For example, the present invention can be applied to all flash memory apparatuses including such a configuration.

The semiconductor memory apparatus of FIG. 3 may include a data latch unit 21, a column selection unit 30, and an auxiliary driving unit 50.

The data latch unit 21 may be configured to detect data of a memory cell, drive the data, and latch the driven data in output nodes QA and QAN. Although this depends on a chosen design, a data voltage logic level of a normal memory cell may be stored in the first output node QAN and an opposite value of the data voltage logic level of the memory cell may be stored in the second output node QA. The data latch unit 21 may be used as a space for temporarily storing data before transmitting the data to an exterior when in the process of reading the data from a memory cell. As described above, the flash memory may have various latch circuits according to the type and implementation scheme thereof. Since the present invention relates to a latch circuit directly connected to data lines DL and DLB, a description for other configurations will be omitted.

When a column selection signal YI is applied and a corresponding column is selected, the column selection unit 30 may connect the output nodes QAN and QA to the data lines DL and DLB, respectively. In a read operation, when the column selection signal YI is applied, the data latched in the output nodes QAN and QA may be transmitted to the data lines DL and DLB.

The auxiliary driving unit 50 may be connected to the output nodes QA and QAN to support the driving force of the data latch unit 21. That is, since the capacity of a transistor included in the column selection unit 30 may be large, the auxiliary driving unit 50 may increase the data driving force of the data latch unit 21 in order to solve a problem because data loading to a low voltage logic level may be required for a relatively long time.

When the corresponding column is selected by the column selection signal YI, the auxiliary driving unit 50 may support the driving force of the data latch unit 21 in response to voltage levels of the output nodes QA and QAN. When it is necessary to drive the auxiliary driving unit 50 only in the read operation in which a data detection operation may be performed, the auxiliary driving unit 50 may be designed so as to respond to a read command signal READ. Since the first output node QAN and the second output node QA may always have opposite voltage logic levels (i.e., high and low voltage logic levels), when the voltage logic level of the first output node QAN is low, the auxiliary driving unit 50 may support the driving to the low voltage logic level of the first output node QAN. When the voltage logic level of the second output node QA is low, the auxiliary driving unit 50 may support the driving to the low voltage logic level of the second output node QA.

That is, in the present embodiment, the driving force of the data latch unit 21 for allowing the output nodes QA and QAN to enter the low voltage logic level is enhanced, so that a data transmission speed of the column selection unit 30 is increased, resulting in a reduction of a data detection time from the exterior.

Figure 4:
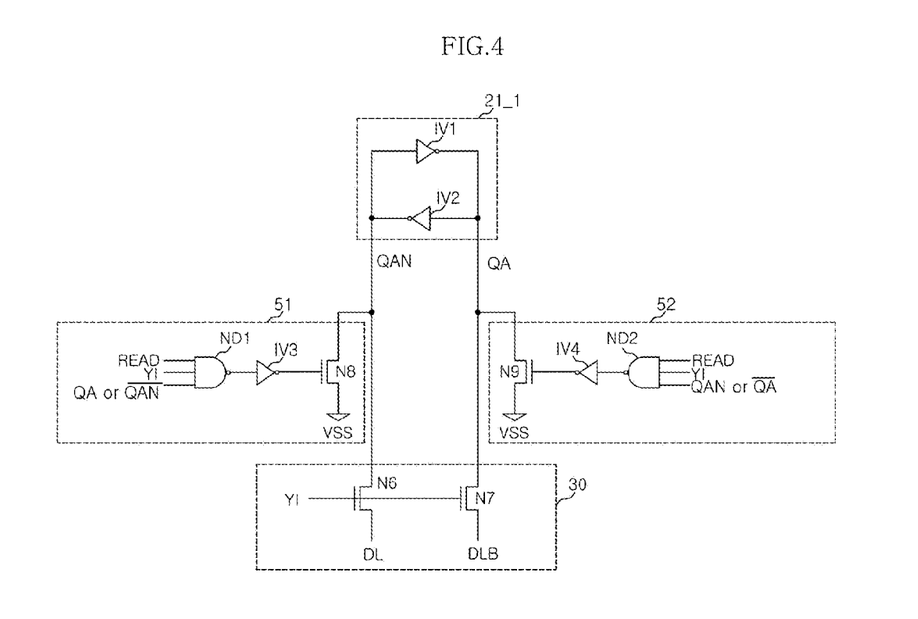
FIG. 4 is a detailed circuit diagram illustrating an example of a semiconductor memory apparatus of FIG. 3 according to an embodiment.

FIG. 4 is a detailed circuit diagram illustrating an example of a semiconductor memory apparatus according to an embodiment.

The semiconductor memory apparatus illustrated in FIG. 4 may include a latch unit 21_1, a column selection unit 30, a first auxiliary driving unit 51, and a second auxiliary driving unit 52.

The latch unit 21_1 may, for example, correspond to a latch circuit of the data latch unit 21. The latch unit 21_1 may include a latch circuit having first and second inverters IV1 and IV2. Thus, the first output node QAN and the second output node QA may have opposite voltage logic levels. In the present embodiment, it is assumed that a data voltage logic level of a memory cell may be stored in the first output node QAN and an opposite value of the data voltage logic level of the memory cell may be stored in the second output node QA.

The column selection unit 30 may include a sixth NMOS transistor N6 and a seventh NMOS transistor N7.

The sixth NMOS transistor N6 may be connected to the first output node QAN and the data line DL to receive the column selection signal YI. The seventh NMOS transistor N7 may be connected to the second output node QA and the inverted data line DLB to receive the column selection signal YI.

Furthermore, when the column selection signal YI is applied, since the sixth NMOS transistor N6 and the seventh NMOS transistor N7 are turned on, the first output node QAN may be connected to the data line DL and the second output node QA may be connected to the inverted data line DLB. Thus, the latched pair of data in the output nodes QA and QAN may be loaded on the data lines DL and DLB.

The first auxiliary driving unit 51 may include a first NAND gate ND1, a third inverter IV3, and an eighth NMOS transistor N8.

The first NAND gate ND1 may receive the read command signal READ, the column selection signal YI, and the voltage level of the second output node QA, perform a NAND operation on the received signals, and output a resultant signal. At this time, since the data voltage logic level of the second output node QA may be opposite to that of the first output node QAN, the first NAND gate ND1 may receive an inverted data voltage logic level of the first output node QAN, instead of the data voltage logic level of the second output node QA.

The third inverter IV3 may invert the output of the first NAND gate ND1 and then output an inverted signal.

The eighth NMOS transistor N8 may connect the first output node QAN to a ground voltage VSS in response to the output of the third inverter IV3.

That is, in the read operation, when the read command signal READ is applied and a corresponding column is selected by the column selection signal YI, if the voltage logic level of the second output node QA is high, the eighth NMOS transistor N8 may connect the first output node QAN to the ground voltage VSS, so that data loading of the first output node QAN may be reduced.

The second auxiliary driving unit 52 may include a second NAND gate ND2, a fourth inverter IV4, and a ninth NMOS transistor N9.

The second NAND gate ND2 may receive the read command signal READ, the column selection signal YI, and the voltage level of the first output node QAN, perform a NAND operation on the received signals, and output a resultant signal. At this time, since the data voltage logic level of the first output node QAN may be opposite to that of the second output node QA, the second NAND gate ND2 may receive an inverted data voltage logic level of the second output node QA, instead of the data voltage logic level of the first output node QAN.

The fourth inverter IV4 may invert the output of the second NAND gate ND2 and output an inverted signal.

The ninth NMOS transistor N9 may connect the second output node QA to the ground voltage VSS in response to the output of the fourth inverter IV4.

That is, in the read operation, when the read command signal READ is applied and a corresponding column is selected by the column selection signal YI, if the voltage logic level of the first output node QAN is high, the ninth NMOS transistor N9 may connect the second output node QA to the ground voltage VSS, so that data loading of the second output node QA may be reduced.

Instead of the NMOS transistors N8 and N9 used in the first and second auxiliary driving units 51 and 52, PMOS transistors may be used.

Figure 5:
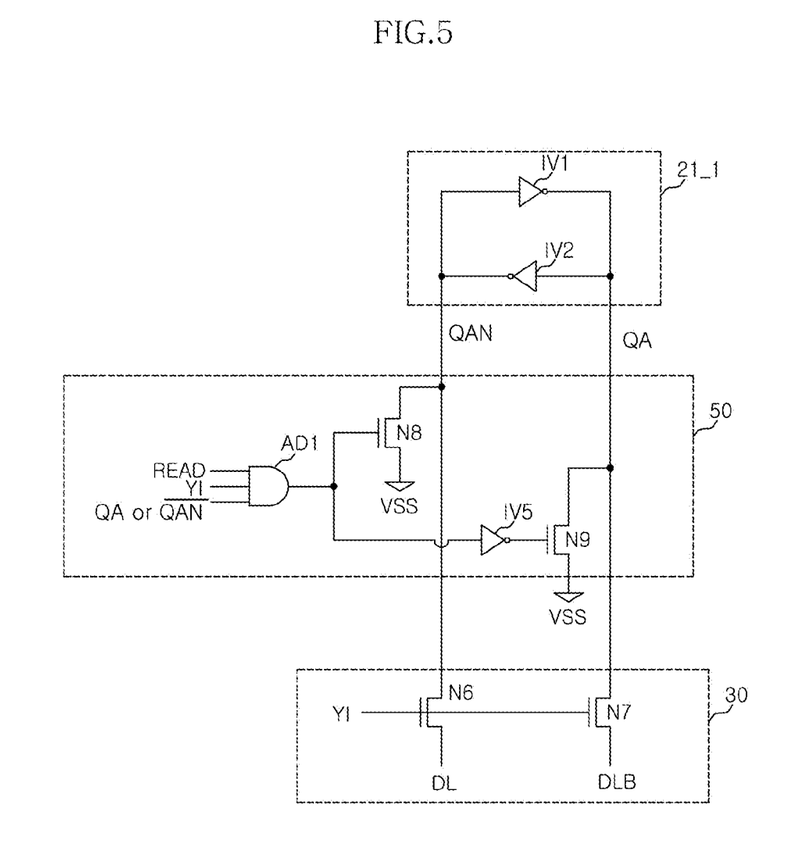
FIG. 5 is a circuit diagram illustrating an example of a semiconductor memory apparatus of FIG. 3 according to another embodiment.

FIG. 5 is a circuit diagram illustrating the semiconductor memory apparatus of FIG. 3 according to another embodiment.

In the semiconductor memory apparatus of FIG. 5 according to the embodiment, the latch unit 21_1 and the column selection unit 30 may have the same configurations as in the embodiment of FIG. 4. However, it may be advantageous that it be possible to minimize the number of elements provided in a design when realizing the auxiliary driving unit 50.

The auxiliary driving unit 50 of FIG. 5 may include a first AND gate AD1, an eight NMOS transistor N8, a fifth inverter IV5, and a ninth NMOS transistor N9.

The first AND gate AD1 may receive the read command signal READ, the column selection signal YI, and the level of the second output node QA or an inverted voltage logic level of the first output node QAN.

The eight NMOS transistor N8 may connect the first output node QAN to the ground voltage VSS according to the output of the first AND gate AD1.

The fifth inverter IV5 may invert the output of the first AND gate AD1.

The ninth NMOS transistor N9 may connect the second output node QA to the ground voltage VSS according to the output of the fifth inverter IV5.

According to the present embodiment, in the data read operation, based on the fact that the first output node QAN and the second output node QA may always have substantially opposite voltage logic levels, the two drivers N8 and N9 may be driven using only one AND gate AD1. That is, the eight NMOS transistor N8 connected to the first output node QAN may be controlled by the output of the first AND gate AD1, and the ninth NMOS transistor N9 connected to the second output node QA may be controlled by the inverted output of the first AND gate AD1.

An operation of the semiconductor memory apparatus of FIG. 5 may be similar to the operation of the semiconductor memory apparatus of FIG. 4. When activated read a command signal and a column selection signal may be input, if the voltage level of the second output node QA is high or the voltage level of the first output node QAN is low, the first output node QAN may be connected to the ground voltage VSS. Meanwhile, when the activated read command signal and column selection signal are input, if the voltage level of the second output node QA is low or the voltage level of the first output node QAN is high, the second output node QA may be connected to the ground voltage VSS.

As described above, according to the present embodiment, the auxiliary driving unit 50 may be provided to enhance the driving force of the latch unit 21_1 for allowing the output nodes QA and QAN to enter a low voltage logic level, so that a voltage logic level difference between loaded pairs of data on the data lines DL and DLB can be generated quickly.

As a consequence, the semiconductor apparatus according to the present embodiment may shorten the data detection time from the exterior.

Figure 6:
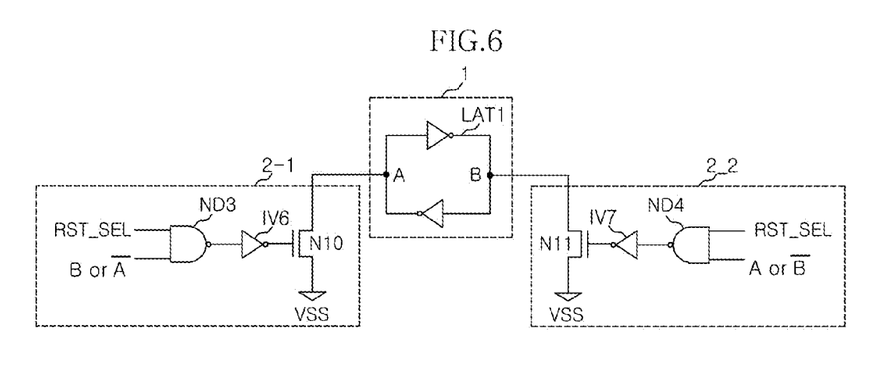
FIG. 6 is a circuit diagram of an example of a semiconductor memory apparatus according to an embodiment.

FIG. 6 is a circuit diagram illustrating an example of a reset latch circuit of the semiconductor memory apparatus.

The semiconductor memory apparatus may include various latch circuits as well as a page buffer circuit and a latch circuit. Thus, the technology of supporting the driving force of the latch circuit using the output node voltage logic level of the aforementioned latch circuit may also be applied to various latch circuits.

FIG. 6 illustrates the reset latch circuit according to the present embodiment, and the reset latch circuit may include a latch circuit 1, and auxiliary driving units that may be required when the latch circuit 1 is driven to reset a voltage level.

The latch circuit 1 may have a structure LAT1 in which two inverters are connected to each other, and may drive and may latche a level and an inverted voltage logic level in a first node A and a second node B. when a reset selection signal for resetting the latch circuit 1 is activated, the latch circuit 1 may drive and may latche a voltage level set in the first node A and the second node B.

The auxiliary driving units may include a first auxiliary driving unit 2_1 and a second auxiliary driving unit 2_2.

The first auxiliary driving unit 2_1 may include a third NAND gate ND3, a sixth inverter IV6, and a tenth NMOS transistor N10.

The third NAND gate ND3 may receive a reset selection signal RST_REL and a voltage logic level of the second node B or an inverted voltage logic level of the first node A.

The sixth inverter IV6 may invert the output of the third NAND gate ND3.

The tenth NMOS transistor N10 may connect the first node A to the ground voltage VSS according to the output of the sixth inverter IV6.

That is, when the reset selection signal RST_REL is activated, if the second node B is reset to a high voltage logic level and the first node A is reset to a low voltage logic level, the first auxiliary driving unit 2_1 may connect the first node A to the ground voltage VSS, thereby supporting the driving force to the low voltage logic level of the latch circuit 1.

The second auxiliary driving unit 2_2 may include a fourth NAND gate ND4, a seventh inverter IV7, and an eleventh NMOS transistor N11.

The fourth NAND gate ND4 may receive the reset selection signal RST_REL, and a voltage logic level of the first node A or an inverted voltage logic level of the second node B.

The seventh inverter IV7 may invert the output of the fourth NAND gate ND4.

The eleventh NMOS transistor N11 may connect the second node B to the ground voltage VSS according to the output of the seventh inverter IV7.

That is, when the reset selection signal RST_REL is activated, if the first node A is reset to a high voltage logic level and the second node B is reset to a low voltage logic level, the second auxiliary driving unit 2_2 may connect the second node B to the ground voltage VSS, thereby supporting the driving force to the low voltage logic level of the latch circuit 1.

Figure 7:
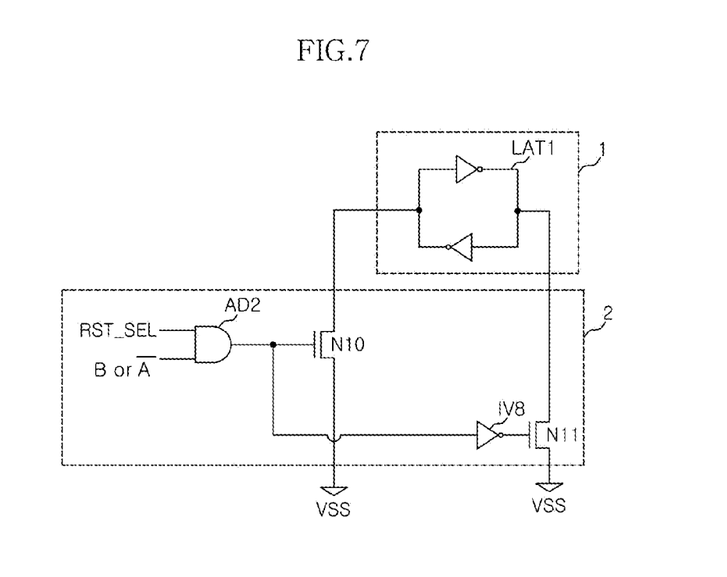
FIG. 7 is a circuit diagram illustrating an example of a semiconductor memory apparatus of FIG. 6 according to another embodiment.

FIG. 7 is a circuit diagram illustrating an example of a rest latch circuit of the semiconductor memory apparatus of FIG. 6 according to another embodiment.

In the semiconductor memory apparatus of FIG. 7 according to the present embodiment, the latch circuit 1 may have substantially the same configuration as in the embodiment of FIG. 6. However, it may be advantageous that it be possible to minimize the number of elements provided for in a design when realizing an auxiliary driving unit 2.

The auxiliary driving unit 2 of FIG. 7 may include a second AND gate AD2, a tenth NMOS transistor N10, an eight inverter IV8, and an eleventh NMOS transistor N11.

The second AND gate AD2 may receive the reset selection signal RST_REL and the voltage logic level of the second node B or the inverted voltage logic level of the first node A.

The tenth NMOS transistor N10 may connect the first node A to the ground voltage VSS according to the output of the second AND gate AD2.

The eight inverter IV8 may invert the output of the second AND gate AD2.

The eleventh NMOS transistor N11 may connect the second node B to the ground voltage VSS according to the output of the eight inverter IV8.

According to the present embodiment, based on the fact that the first output node QAN and the second output node QA may always have substantially opposite voltage logic levels, the two drivers N10 and N11 may be driven using only one AND gate AD2. That is, the tenth NMOS transistor N10 connected to the first node A may be controlled by the output of the second AND gate AD2, and the eleventh NMOS transistor N11 connected to the second node B may be controlled by the inverted output of the second AND gate AD2.

An operation of the semiconductor memory apparatus of FIG. 7 may be similar to the operation of the semiconductor memory apparatus of FIG. 6. When an activated reset selection signal is input, if the voltage level of the second node B is high or the voltage level of the first node A is low, the first node A may be connected to the ground voltage VSS. Meanwhile, when the activated reset selection signal is input, if the voltage level of the second node B is low or the voltage level of the first node A is high, the second node B may be connected to the ground voltage VSS.

As described above, according to the present embodiment, the auxiliary driving unit 2 may be provided to enhance the driving force to the low voltage logic level of the latch unit 1, so that it is possible to increase an operation speed of the semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A system having a semiconductor integrated circuit, comprising:
 a first unit configured to be driven in response to a reset selection signal, wherein the first unit includes a first node and a second node as output nodes; and
 a second unit configured to be connected to one of the first node and the second node, to receive the reset selection signal and a selected one of an inverted voltage of the first node and a voltage of the second node as input signals, and to support a driving force of the first unit in response to the reset selection signal and the selected voltage,
 wherein the first node and the second node have substantially opposite voltage logic levels and a voltage logic level of the selected node is a higher than that of a non-selected node.

2. The system according to claim 1, wherein, when the reset selection signal is activated and the second node is at the high voltage logic level, the second unit connects the first node to a ground voltage.

3. The system according to claim 1, wherein, when the reset selection signal is activated and the first node is at a low voltage logic level, the second unit connects the first node to a ground voltage.

4. The system according to claim 1, wherein, when the reset selection signal is activated and the first node is at the high voltage logic level, the second unit connects the second node to a ground voltage.

5. The system according to claim 1, wherein, when the reset selection signal is activated and the second node is at a low voltage logic level, the second unit connects the second node to a ground voltage.

6. The system according to claim 1, wherein the first unit includes a latch circuit.

7. The system according to claim 1, wherein the second unit comprises:
 an AND gate configured to receive the reset selection signal and the voltage logic level of the second node;
 a first NMOS transistor configured to connect the first node to a ground voltage in response to an output of the AND gate; and
 a second NMOS transistor configured to connect the second node to the ground voltage in response to an inverted output of the AND gate.

8. The system according to claim 1, wherein the second unit comprises:
 a connecting unit configured to electrically connect the one of the first node and the second node and a ground voltage in response to a control signal; and
 a control signal-generating unit configured to generate the control signal according to a voltage logic level of the first or the second nodes.

9. The system according to claim 8, wherein the connecting unit includes:
 a first NMOS transistor configured to connect the first node to a ground voltage in response to the control signal; and
 a second NMOS transistor configured to connect the second node to the ground voltage in response to an inverted control signal.

10. The system according to claim 9, wherein the control signal-generating unit includes an AND gate configured to receive the reset signal and the voltage logic level of the second node.

11. A system having a semiconductor integrated circuit comprising:
 a first unit configured to be driven in response to a reset selection signal and resetting a first node and a second node which are output nodes; and
 a second unit configured to connect the first node to a ground voltage and to receive the reset selection signal and a selected one of a voltage of the second node and an inverted voltage of a voltage at the first node as input signals, in response to the reset selection signal and the selected voltage; and
 a third unit configured to connect the second node to the ground voltage and to receive the reset selection signal and a selected one of a voltage of the first node or an inverted voltage of a voltage at the second node as input signals, in response to the reset selection signal and the selected voltage of the third unit,
 wherein the first node and the second node have opposite voltage logic levels and the voltages of the first and second nodes are used as the input signals of the second and third unit.

12. The system according to claim 11, wherein the second unit comprises:
 a first AND gate configured to receive the reset selection signal and a voltage logic level of the second node; and
 a first NMOS transistor configured to connect the first node to the ground voltage in response to an output of the first AND gate.

13. The system according to claim 11, wherein the second unit comprises:
 a first AND gate configured to receive the reset selection signal and an inverted voltage logic level of the first node; and
 a first NMOS transistor configured to connect the first node to the ground voltage in response to an output of the first AND gate.

14. The system according to claim 11, wherein the third unit comprises:
 a second AND gate configured to receive the reset selection signal and a voltage logic level of the first node; and
 a second NMOS transistor configured to connect the second node to the ground voltage in response to an output of the second AND gate.

15. The system according to claim 11, wherein the third unit comprises:
 a second AND gate configured to receive the reset selection signal and an inverted voltage logic level of the second node; and
 a second NMOS transistor configured to connect the second node to the ground voltage in response to an output of the second AND gate.

16. The system according to claim 11, wherein the second unit comprises:
 a connecting unit configured to electrically connect the first node and a ground voltage in response to a control signal; and
 a control signal-generating unit configured to generate the control signal according to a voltage logic level of the first or the second nodes.

17. The system according to claim 16, wherein the connecting unit includes a first NMOS transistor configured to connect the first node to the ground voltage in response to the control signal, and
 wherein the control signal-generating unit includes a first AND gate configured to receive the reset selection signal and a voltage logic level of the second node, perform an AND operating the reset selection signal and the voltage logic level of the second node, thereby generating the control signal.

18. The system according to claim 11, wherein the third unit comprises:
a connecting unit configured to electrically connect the second node and a ground voltage in response to a control signal; and
a control signal-generating unit configured to generate the control signal according to a voltage logic level of the first or the second nodes.

19. The system according to claim 18, wherein the connecting unit includes a second NMOS transistor configured to connect the second node to the ground voltage in response to the control signal, and
wherein the control signal-generating unit includes a second AND gate configured to receive the reset selection signal and a voltage logic level of the first node, perform an AND operating the reset selection signal and the voltage logic level of the first node, thereby generating the control signal.

* * * * *